(12) United States Patent
Coldren et al.

(10) Patent No.: US 6,714,566 B1
(45) Date of Patent: Mar. 30, 2004

(54) TUNABLE LASER SOURCE WITH AN INTEGRATED WAVELENGTH MONITOR AND METHOD OF OPERATING SAME

(75) Inventors: Larry A. Coldren, Santa Barbara, CA (US); Thomas Gordon Beck Mason, San Jose, CA (US); Gregory Fish, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/914,728

(22) PCT Filed: Feb. 29, 2000

(86) PCT No.: PCT/US00/05235
§ 371 (c)(1),
(2), (4) Date: Jan. 3, 2002

(87) PCT Pub. No.: WO00/52789
PCT Pub. Date: Sep. 8, 2000

Related U.S. Application Data

(60) Provisional application No. 60/122,194, filed on Mar. 1, 1999.

(51) Int. Cl.[7] .................................................. H01S 3/10
(52) U.S. Cl. ............................................. 372/20; 372/9
(58) Field of Search ........................................ 372/9, 20

(56) References Cited

U.S. PATENT DOCUMENTS 5,798,859 A  *  8/1998  Colbourne et al. ......... 359/247
6,559,946 B2 *  5/2003  Davidson et al. ........... 356/450

\* cited by examiner

*Primary Examiner*—Paul Ip
*Assistant Examiner*—Leith Al-Nazer
(74) *Attorney, Agent, or Firm*—Daniel L. Dawes; Myers Dawes Andras & Sherman LLP

(57) ABSTRACT

A wavelength monitor is provided based on the transmission response of an optical filter. The monitor provides feedback to the laser enabling it to lock to any given wavelength within its tuning range. The invention is also a process for integrating the wavelength monitor directly on chip with a variety of tunable semiconductor lasers. The invention also comprises a method for controlling the wavelength of a tunable laser by using a wavelength monitor to measure the output light and provide feedback to a control system. The laser and wavelength monitor are integrated together on a single indium phosphide chip. The wavelength monitor comprises a filter with a wavelength dependent transmission function and a pair of detectors. One detector is illuminated with light that has passed through the filter and the other provides a reference to measure the input intensity. Taking the ratio of the filtered light level to the unfiltered light provides a wavelength dependent wavelength. The filter is designed such that the transmission function is monotonic and varies from a minimum at one extent of the laser's tuning range to a maximum at the other extent.

32 Claims, 11 Drawing Sheets

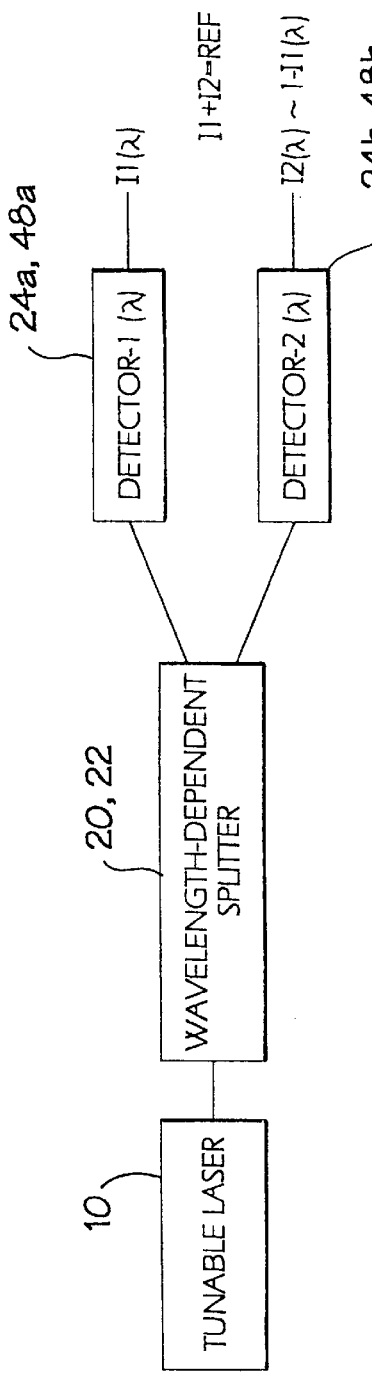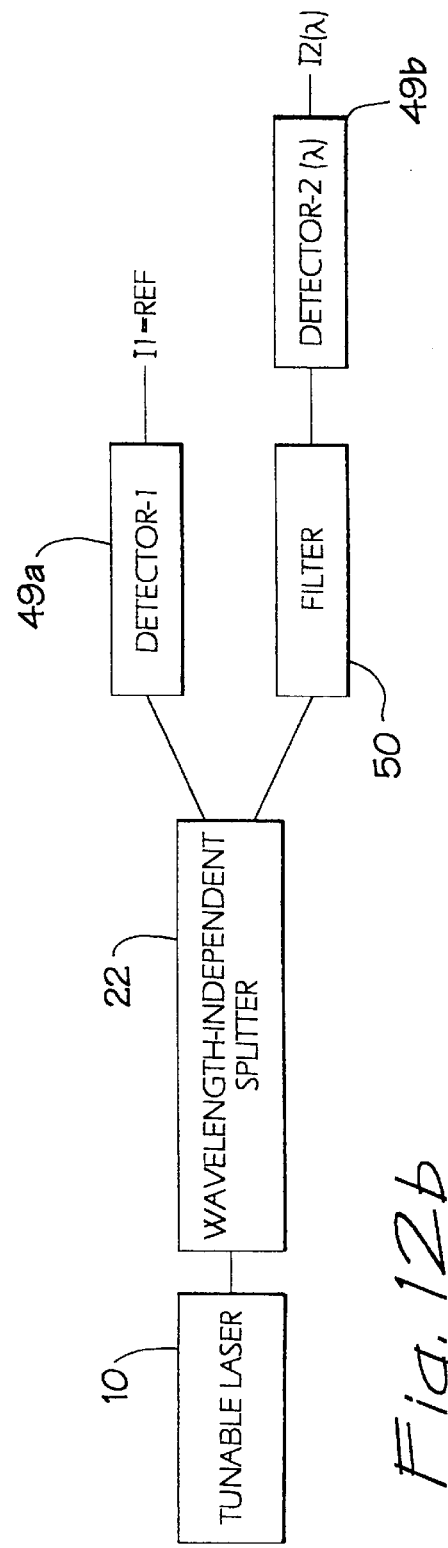
Fig. 12a
Fig. 12b

TUNABLE LASER SOURCE WITH AN INTEGRATED WAVELENGTH MONITOR AND METHOD OF OPERATING SAME

Related Applications

The present application is related to U.S. Provisional Patent Application, serial No. 60/122,194, filed on Mar. 1, 1999.

This invention was made with Government support under Grant No. N00014-96-1-6014 awarded by the Office of Naval Research. The Government has certain rights in this invention.

BACKGROUND OF THE INVENTION

1. Field of the Invention

The invention relates to the field of semiconductor lasers, and in particular to tunable semiconductor lasers.

2. Description of the Prior Art

There are a variety of semiconductor laser designs in which the wavelength can be tuned by current injection into a section which has some spectral filtering characteristic. Examples of these are moderately tunable devices such as the distributed Bragg reflector laser, which consists of a gain section, a phase control section and a grating mirror, and widely tunable lasers that employ Vernier effect tuning like the sampled grating distributed Bragg reflector lasers. In all of these devices precise control of the tuning current is required to achieve the desired output wavelength. The amount of current required to achieve a given wavelength can vary with the device temperature and also with aging. Over time as the laser ages changes in the leakage current and the carrier lifetime in the tuning sections cause the wavelength to drift. This variation in the tuning characteristics requires the use of some sort of feedback control system in order for such tunable lasers to be used in applications where precise wavelength control must be maintained such as dense wavelength division multiplexed (WDM) communications systems.

Single wavelength devices such as distributed feedback lasers are also subject to wavelength drift. For these devices simple wavelength lockers are used with temperature or current feedback to control the wavelength of the laser. However these wavelength lockers are only capable of maintaining the laser wavelength on a single channel which makes them useless as multiple-channel tunable lasers.

Tunable semiconductor lasers are important components for next generation dense wavelength division multiplexed fiber optic networks.

What is needed is frequency stable, tunable laser module whose output frequency does not change over time. The device should be integrated on a chip, compact and cost effective. It should have a wide tuning range and be usable in high speed data transmission under direct modulation in multichannel dense WDM networks.

BRIEF SUMMARY OF THE INVENTION

What has been developed is a wavelength monitor based on the transmission response of an optical filter for use in controlling the wavelength of a tunable laser. This monitor can provide feedback on the laser's wavelength over a wide tuning range enabling it to also lock the device to any given wavelength or channel within its tunable range. It can also be used in combination with conventional external lockers to more precisely tune to a particular wavelength within a given channel.

The invention is also a process for integrating the wavelength monitor directly on chip with a variety of tunable semiconductor lasers. This results in a significantly more compact and cost effective device.

The invention comprises a method for controlling the wavelength of a tunable laser by using a wavelength monitor to measure the output light and provide feedback to a control system. In the preferred embodiment the laser and wavelength monitor are integrated together on a single indium phosphide chip. The technique is useful for control of lasers that are tuned by current injection into sections which have a bandgap energy, which is greater than the lasing wavelength.

The wavelength monitor comprises a wavelength filtering element and a pair of detector elements. In one embodiment these elements are combined by using detectors of different bandgap arranged in series. In others a separate filter with a wavelength dependent transmission function is placed in front of the detectors. In some of these embodiments this separate filter is designed as a wavelength dependent splitter to provide an output beam that translates laterally from one detector to the other as a function of wavelength (much like a prism); in other embodiments the laser output is first split into two beams, and a wavelength dependent transmission filter is placed only in one of these prior to illuminating the detectors. In all cases, taking the difference between in the photocurrents in the two detectors, and normalizing by dividing by the sum, provides a measure of the integrated laser's wavelength. In all cases, the net filtering function is designed such that the normalized difference current is monotonic and varies from a minimum at one extent of the laser's tuning range to a maximum at the other extent. This approach can provide channel identification across this entire band of wavelengths, and it can supplement or replace the function of existing external wavelength lockers that only lock within the span of one channel.

More specifically, the invention is an apparatus comprising a tunable laser and a wavelength-dependent optical device to produce two optical signals from light sampled from the laser. The laser is semiconductor laser and wherein the wavelength-dependent optical device is integrally fabricated with the semiconductor laser on a common chip. The two optical signals are wavelength dependent and are distinguished from each other by a different dependence on wavelength. A first and second detector are provided to detect the two optical signals to generate two corresponding electrical detection signals. A processor is coupled to the to first and second detector to generate a control signal from the two corresponding electrical detection signals by which the tunable laser is tuned.

In one embodiment, the wavelength-dependent optical device comprises a two mode interference waveguide. A wavelength-dependent Y-branch splitter is coupled between the two mode interference waveguide and the first and second detector. The first and second detector comprises a segmented detector and further comprises a flared waveguide coupling the two mode interference waveguide and the segmented detector.

In another embodiment, the a wavelength-dependent optical device comprises a wavelength-dependent optical filter. In one embodiment, the wavelength-dependent optical device comprises a wavelength-dependent optical coating. In another embodiment, the a wavelength-dependent optical device comprises a wavelength-dependent optical grating.

In some embodiments, wavelength-dependent optical device comprises one of the two detectors, and is termed a monitoring detector. The monitoring detector has a higher bandgap absorber therein than the other one of the first and second detectors. In one embodiment, the monitoring detector is coupled inline between the tunable laser and the other one of the first and second detectors.

In still another embodiment the apparatus further comprises an attenuator and a filter. The monitoring detector is coupled inline with the other one of the first and second detectors which is coupled to the tunable laser. The attenuator and the filter are coupled in line between the monitoring detector and the other one of the first and second detectors.

In still another embodiment, the apparatus further comprises a splitter. The splitter directs a first portion of light from the laser to the first detector and a second portion of light from the laser to the coating. The second detector detects light reflected from the coating.

In one embodiment, the apparatus further comprises a diffractor. The diffractor directs a first portion of light from the laser into the coating such that the first portion is totally internally reflected and a second portion of light from the laser into the coating such that the second portion of light from the laser is reflected through the coating to the second detector.

The invention is also defined as a method of operating a tunable laser comprising the steps of sampling light from the laser and producing two optical signals from light sampled from the laser. The two optical signals are wavelength dependent and distinguished from each other by a different dependence on wavelength. The two optical signals are detected to generate two corresponding electrical detection signals. A wavelength dependent control signal is generated from the two corresponding electrical detection signals. The control signal is fed back to the tunable laser to control wavelength of light generated by the laser.

Again in one embodiment the step of producing two optical signals is performed by creating a wavelength dependent, beat pattern between two modes of light.

In another embodiment the step of producing two optical signals is performed by monotonically filtering the light as a function of wavelength. For example, the step of producing two optical signals is performed by monotonically filtering the light as a function of wavelength by transmission through a grating or by reflection from a grating. In the latter case, the two optical signals are produced by monotonically filtering the light as a function of wavelength by reflecting the light off a back facet of the tunable laser through a wavelength dependent coating disposed on the back facet.

The tunable laser has a tuning range, and the degree of filtering of the intensity of the light is varied between extremums corresponding to the tuning range of the laser.

The step of creating a wavelength dependent, beat pattern between two modes of light is performed for several beat lengths of the two modes of light and then comprises splitting the two modes light into first and second paths and thereafter detecting the two modes of light in the first and second paths. The step of splitting the sampled light into a first and second path comprises splitting the two modes of light into the first and second path with a wavelength dependent splitting ratio.

The method further comprises determining total power output from the laser by summing the two corresponding electrical detection signals. The wavelength dependent control signal is generated from a ratio of intensity of the light detected corresponding to the two optical signals by normalizing the control signal with the total power output.

In one embodiment, the step of splitting the sampled light comprises transmitting the two modes of light to two segmented detectors. Detection of the two optical signals comprises detecting the light in the two segmented detectors to provide two complementary sinusoidal detection signals. The step of generating a wavelength dependent control signal comprises generating the control signal as a ratio between the difference of the two complementary sinusoidal detection signals and the sum of the two complementary sinusoidal detection signals.

In some embodiments the steps of producing and detecting the two optical signals comprises detecting the light with a first detector with an absorber having a bandgap energy low enough to provide substantially full absorption of the light, and detecting the light with a second detector with an absorber having a bandgap energy slightly greater than the shortest wavelength of the light so that absorption in the second detector varies with wavelength of the light.

In another embodiment the step of producing two optical signals comprises diffracting the light back onto a back facet of the laser so that a portion is totally internally reflected and a portion reflected back from a wavelength dependent coating disposed on the back facet.

In another embodiment the step of producing two optical signals comprises splitting the light into two detectors in which at least one of the detectors detects the light in a wavelength dependent manner. For example, the step of producing two optical signals comprises transmitting the light through a first detector into a second detector in which at least one of the detectors detects the light in a wavelength dependent manner. The step of producing two optical signals comprises transmitting the light first through the first detector and then into the second detector in which at least the first detector detects the light in a wavelength dependent manner. Alternatively, the step of producing two optical signals comprises transmitting the light first through the first detector, then through an attenuator and filter in optical series, and then into the second detector in which at least the second detector detects the light in a wavelength dependent manner.

The invention can also be characterized as a method of operating a tunable laser comprising the steps of sampling light from the laser, and generating two signals from the light sampled from the laser, which two signals are wavelength dependent and distinguished from each other by a different dependence on wavelength. Two detected signals corresponding to the two signals are generated. The two detected signals are combined to produce a wavelength dependent control signal. The laser is tuned by feeding back the wavelength dependent control signal to the tunable laser.

Although the method has been described above for the purposes of grammatical ease in terms of steps, it is to be expressly understood, that the claims are not to be limited by "means" or "steps" restrictions based on a construction under 35 USC 112. The invention having been summarized can be better visualized by turning to the following drawings wherein like elements are referenced by like numerals.

BRIEF DESCRIPTION OF THE DRAWINGS

FIGS. 12a–12f are block diagrams summarizing various embodiments of the invention.

The invention and its various embodiments can be better understood by turning to the following detailed description of the illustrated embodiments. It is to be expressly understood that the invention as defined in the following claims is not to be limited by the illustrated embodiments.

DETAILED DESCRIPTION OF THE PREFERRED EMBODIMENTS

Tunable semiconductor lasers are important components for next generation dense wavelength division multiplexed fiber optic networks. The wide tuning range, and ability for high speed data transmission under either direct or external modulation, of sampled grating, distributed Bragg reflector (SGDBR) lasers makes them especially attractive for use in multichannel dense WDM networks. These lasers tune over wide wavelength ranges by employing Vernier effect tuning. Wavelength control in these devices requires the alignment of reflection peaks from the front and back mirrors with the cavity mode at the desired wavelength. This entails control of four separate tuning currents to achieve complete wavelength coverage over the entire tuning range. Using feedback on the output wavelength and intensity, it is possible to lock the device at the optimum operating point for a given wavelength.

Existing devices for monitoring the wavelength and output power of a tunable laser are too complicated and expensive for practical application. What has been devised is a compact integrated wavelength monitor that can be fabricated on chip with a tunable laser to provide feedback on the wavelength and output power. In another embodiment there is an external version of the same monitor which is low cost and highly stable.

Figure 1:
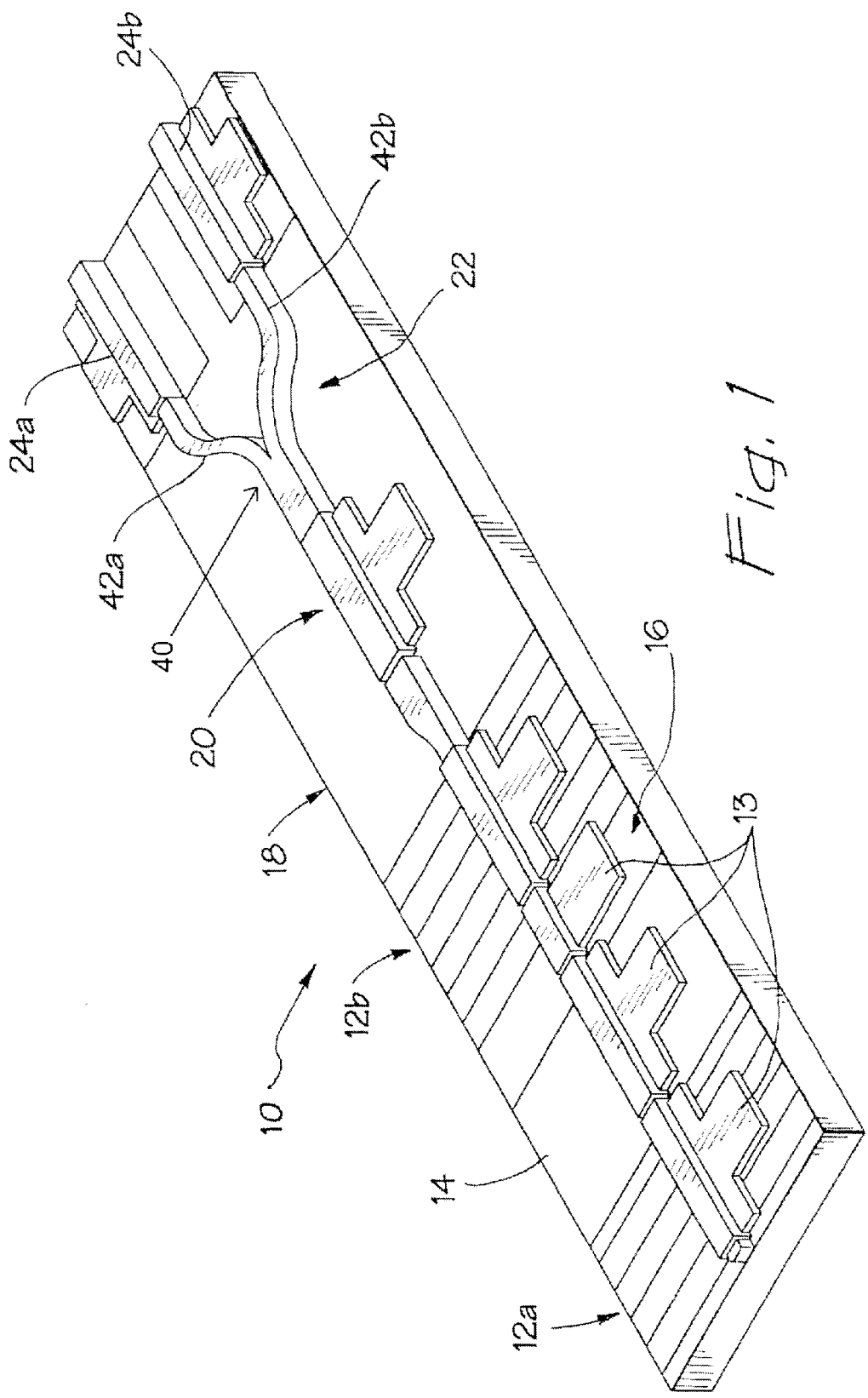
FIG. 1 is a perspective schematic of a tunable laser fabricated according to the invention.

In the preferred embodiment the apparatus of the invention is comprised of a SGDBR laser coupled to a wavelength dependent splitter and a pair of integrated detectors. A schematic of the device is shown in FIG. 1. The tunable laser, generally denoted by reference numeral 10, is a 3 $\mu$m wide ridge waveguide device which is comprised of four separate elements. These include two sampled grating DBR mirrors 12a and 12b and sections for gain control 14 and phase control 16. By controlling the injection current into gain control 14 and phase control 16, laser 10 can be made to tune over more than 40 nm with continuous wavelength coverage. At the output 18 of the back mirror section 12b, the laser waveguide is asymmetrically coupled into a two mode interference (TMI) waveguide 20. At the end of the TMI section 20, there is a Y-branch splitter 22 that divides the light into a pair of output detectors 24a and 24b. This ratiometric design results in a compact easily fabricated wavelength monitor, generally denoted by reference numeral 26.

Figure 3A:
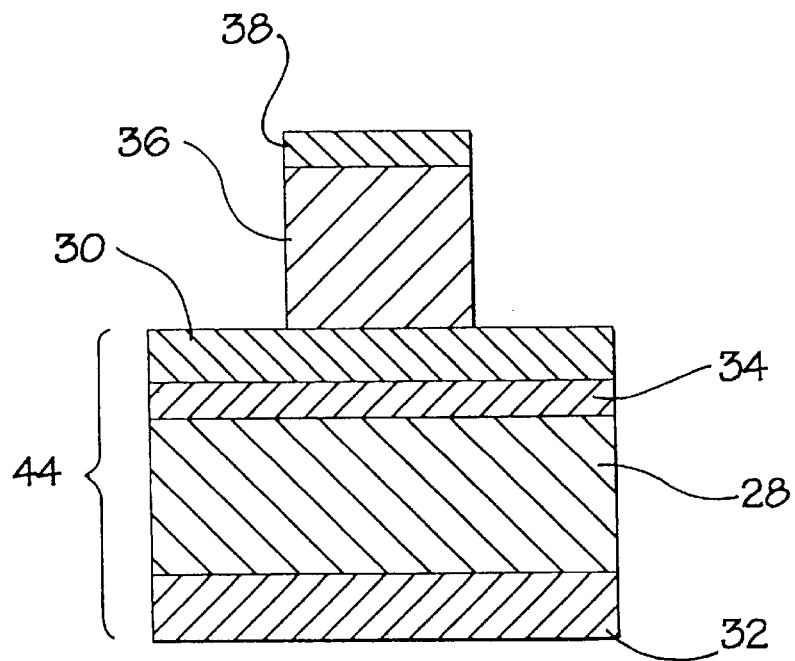
FIG. 3a is a side cross-sectional view of an active section of the laser.
Figure 3B:
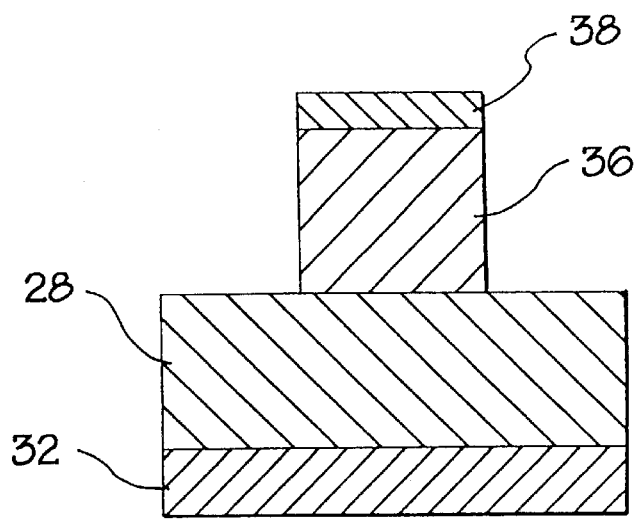
FIG. 3b is a side cross-sectional view of a passive section of the laser.

The generalized transverse active device structure as shown in side cross-sectional view of FIG. 3a is comprised of a thick higher bandgap energy waveguide layer 28 with an offset multiquantum well active region 30. Waveguide 30, which in the illustrated embodiment is a 400 nm, 1.4Q waveguide, is disposed on a 300 nm n-type buffer layer 32. The thick high bandgap waveguide layer 28 is necessary for good carrier-induced index change in the tuning sections, which are comprised of sampled grating DBR mirrors 12a and 12b and sections for gain control 14 and phase control 16. In the case of the active section of FIG. 3a, an InP etch stop layer 34 is disposed on waveguide layer 28 on which strained quantum well active layer 30 is in turn disposed. In the case of a passive section, layers 34 and 30 are omitted. Nonabsorbing passive elements as shown in the side cross-sectional view of FIG. 3b are formed by selectively removing the quantum wells from on top of the waveguide 28. A p-type InP ridge 36 is then disposed on quantum well layer 30 in the case of an active section as shown in FIG. 3a or on waveguide 28 in the case of a passive section as shown in FIG. 3b. A 100 nm InGaAs contact layer 38 is then disposed on top of ridge 36. The use of the offset quantum wells 30 allows the formation of active and passive sections in a single waveguide without having to perform a butt joint regrowth. This allows the device to be fabricated with only two chemical vapor deposition (MOCVD) growth steps.

Figure 2:
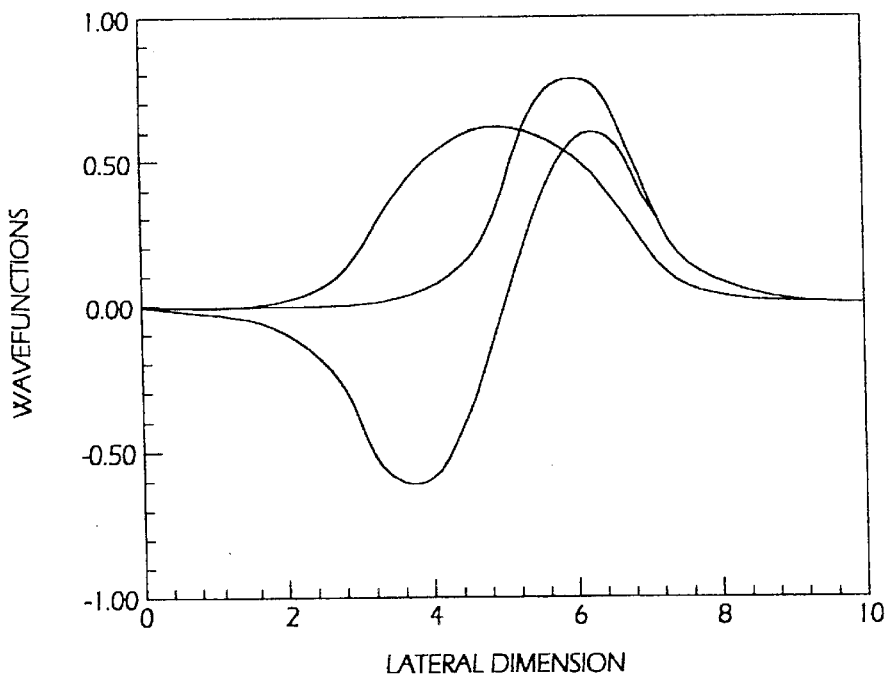
FIG. 2 is a graph of wavefunction intensity showing the overlap of two mode interference waveguide modes with a laser mode in a TMI waveguide section as a function of lateral dimension.

Light coupled from the laser 10 into the TMI section 20 excites the two lowest order lateral modes of the waveguide as shown in the graph of FIG. 2. These modes propagate with different phase velocities which leads to a characteristic beating in a modal superposition pattern. The beat length is dependent on the difference in the propagation constants for the two modes which each depend on the wavelength of the light. At the end of the TMI section 20, a Y-branch splitter 40 splits the light into a pair of output waveguides 42a and 42b with a wavelength dependent splitting ratio. By making the TMI section 20 long enough to contain several beat lengths, the splitting ratio becomes increasingly sensitive to the wavelength of the laser 10. The total power out of the back facet 18 of the laser 10 can be determined by summing the currents from both detectors 24a and 24b. The wavelength dependent signal is normalized to this sum to remove the power dependence. This results in a sinusoidal output signal that varies with wavelength. The TMI waveguide 20 is wide at its end to enhance the optical coupling and tapers quadraticly along its central interference section to increase the modal dispersion. The splitter 40 employs a Y-branch design to divide the incoming optical power into two output waveguides 42a and 42b. The output waveguides 42a and 42b contain the photodetectors 24a and 24b respectively which measure the divided light intensity. Large detector sizes are used to prevent saturation of their absorption by the high optical power levels that are experienced in the photonic integrated circuit.

Figure 8:
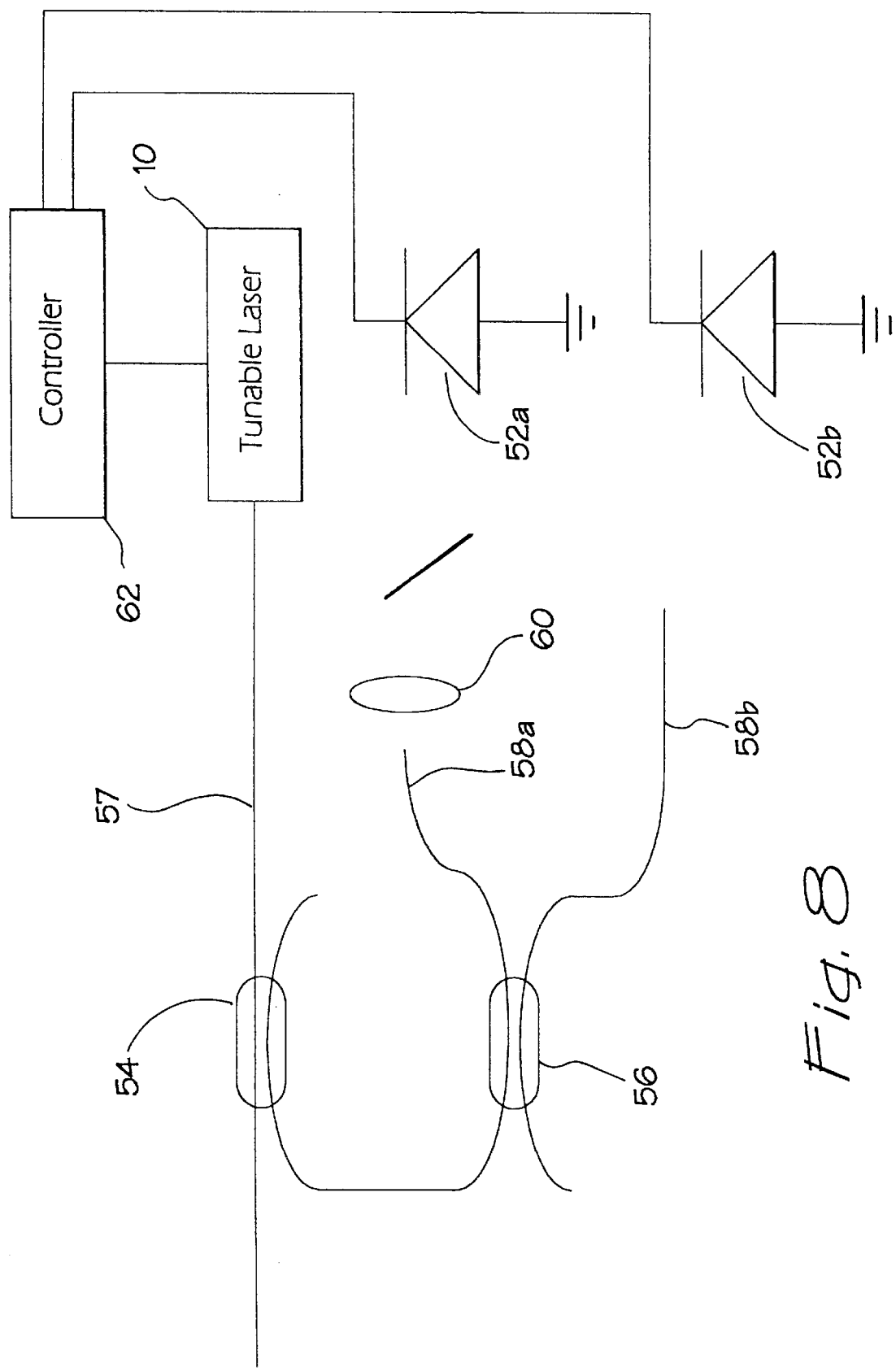
FIG. 8 is a schematic diagram of another embodiment in which the wavelength monitor is implemented with external or nonintegrated components.

The detector signals can then be coupled to a conventional processor or controller circuit (not shown) where the control signal is generated from the ratio of the detection signals, normalized if needed, and coupled to laser 10 to provide the appropriate tuning control. The manner in which the data or signals are processed according to the teachings of the invention is conventional and therefore will not be further illustrated in detail. It is contemplated that the processor or controller circuit will be integrated or assembled into the chip or may be externally provided as shown in FIG. 8 below.

A key advantage of the TMI-based wavelength monitor 26 is that it can be fabricated using many of the steps required for tunable lasers 10, making it relatively easy to integrate on chip. There are eight main steps in the fabrication procedure for the SGDBR laser with the integrated wavelength monitor. First, a base structure 44 is grown using near atmospheric MOCVD with tertiarybutlyphosphine and tertiarybutylarsine for the group V sources. The transverse structure for the active and passive sections are shown in FIGS. 3a and 3b respectively. Passive sections are formed by selectively etching off the cap layer (not shown) and then the quantum wells 30. The gratings 12a and 12b are then formed for the laser mirrors using a dry etch process.

In the second MOCVD step, a 2 $\mu$m InP upper cladding layer 36 and a 100 nm InGaAs contact layer 38 are regrown. The ridge waveguides are etched to within 200 nm of the waveguide layer using a methane-hydrogen-argon MHA RIE etch. A wet etch (HCL:$H_3PO_4$) is then used to remove the last 200 nm and stop on the waveguide 28. The dry etch is done to maintain the straight side walls in the curved waveguide section, while the final wet etch compensates for the nonuniformity in the MHA RIE and provides for consistent etch depth. A $SiN_x$ layer (not shown) is used to passivate the surface with self-aligned openings on the ridge tops for the Ti/Au p-contacts 13. Isolation between the adjacent laser sections and between the detectors is achieved by etching off the contact layer 38 and performing a deep proton implant (not shown). This step is essential for providing good isolation between the reversed biased detectors 24a and 24b and the forward biased laser sections 10. In the final steps, the device is lapped to 100 $\mu$m thick, and a backside contact (not shown) is deposited before cleaving and mounting.

It is also possible to fabricate this device with a buried heterostructure. In this case the Y-branch splitter and detector pair of FIG. 1 can still be used, but in FIG. 4 an alternative embodiment is shown in which a tapered waveguide 46 with two detectors 48a and 48b placed on each side are used in place of the Y-branch splitter 40. The output mode from the TMI waveguide 20 is then imaged on the region between the detectors 48a and 48b to provide a position sensitive output difference circuit. The fabrication is similar to the ridge process except that the ridge is etched prior to regrowth and the etch proceeds until it has cut completely through the waveguide 28. Then in the regrowth InP material is grown up around the ridge completely burying it. The contact layer 38 is then patterned so that it only covers the area directly over the buried ridge 36 and a proton implantation step is also used to prevent lateral current spreading.

Figure 5:
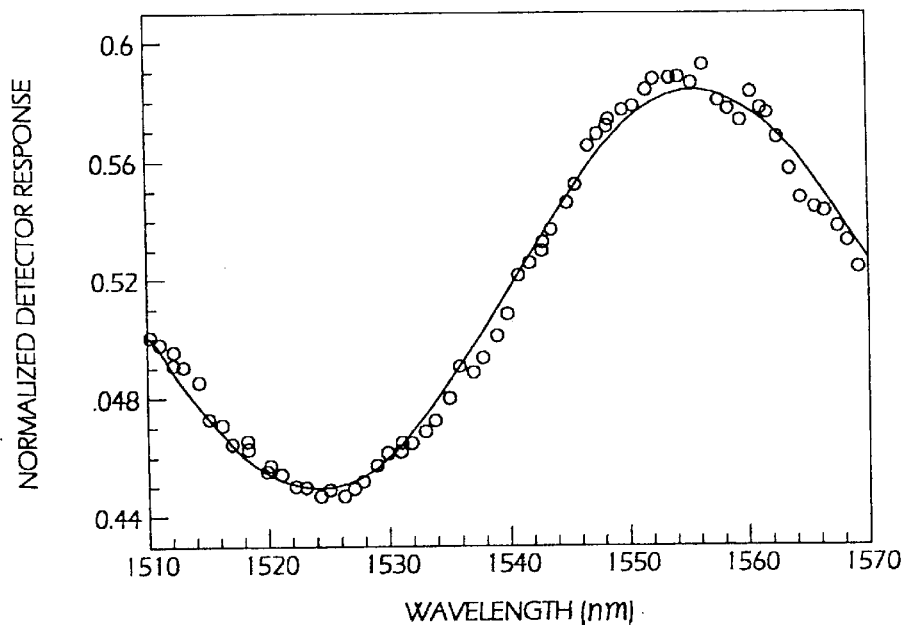
FIG. 5 is a graph of the normalized detector response as a function of wavelength for the embodiment of FIG. 4 showing sinusoidal wavelength dependence.
Figure 6:
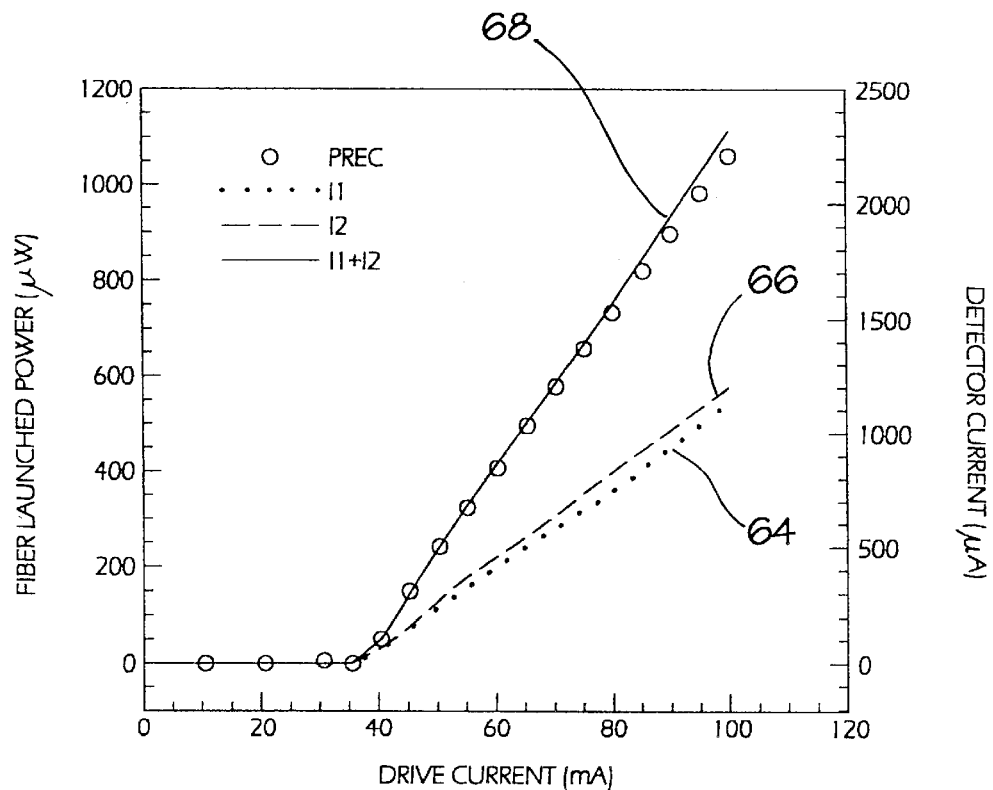
FIG. 6 is a graph of fiber launched power and detector current as a function of drive current for the embodiment of FIG. 4 with fixed tuning currents.

When the wavelength of the laser 10 is tuned, the two detectors 48a and 48b provide complementary sinusoidal responses for wavelength monitoring. Taking the ratio of the difference between the detector currents to the sum of the detector currents provides a single monotonically varying signal which is wavelength dependent and power level independent as shown in the graph of FIG. 5. The sum of the two detector currents can be used to monitor the laser output power as shown in the graph of FIG. 6. The current from detector 48a is shown by line 64, the current from detector 48b is shown by line 66, and their sum is shown by line 68. Dots 70 show the measured launched power in the output fiber. It is important for both this and the operation of the wavelength monitor 26 that the photodiode response is as close to linear as possible and that both detectors 48a and 48b are well matched. Again the detection signals are processed by a signal processor or controller (not shown) according to conventional means consistent with the teachings of the invention.

Another potential embodiment for the wavelength monitor 26 would replace the TMI-Y branch wavelength-dependent splitter with a simple wavelength-independent Y-branch splitter and combine this with a wavelength-dependent detection in one branch. The wavelength-dependent detection is accomplished either by integrating a waveguide filter in front of one of the two detectors, say detector 24b, or by using a higher bandgap absorber material in detector 24b so that it has an inherent wavelength dependence. In both cases, the filtering is designed to provide a monotonically varying detection current from detector 24b across the tuning range of the tunable laser. The operation is similar to the external implementations to be illustrated below in FIGS. 8 and 9.

In the case of the separate filter element, this can be formed by etching a grating filter across the waveguide leading to detector 24b at the same time the gratings are etched for the mirrors of the tunable laser. It is desirable to use a different period grating to provide for the desired monotonic response as well as angle it with respect to the waveguide axis so that the rejected light does not reflect back into the laser. Alternatively, for this and other embodiments, a wavelength independent absorber can be placed between the output of the laser and the Y-branch splitter to isolate the wavelength monitor from the laser. In the case of a detector which is given a wavelength dependent absorption, an absorber with higher bandgap energy and a relatively short length is used to limit the absorption of lower energy photons. This is created by either modifying the originally grown material by such processes as quantum-well intermixing or by employing selective area growth. Both techniques are well known to those skilled in the art.

Reference detector 24a would retain the lower bandgap material of the tunable-laser gain section so that all light reaching it would be fully absorbed, thereby making its output current proportional to the total optical power produced by the laser. Thus, the output of detector 24a serves as a wavelength independent reference. Dividing the current from wavelength dependent detector 24b by that from 24a provides the desired normalized wavelength monitoring signal. These currents are processed by a signal processor or controller (not shown) accordingly to conventional means consistent with the teachings of the invention.

Figure 7A:
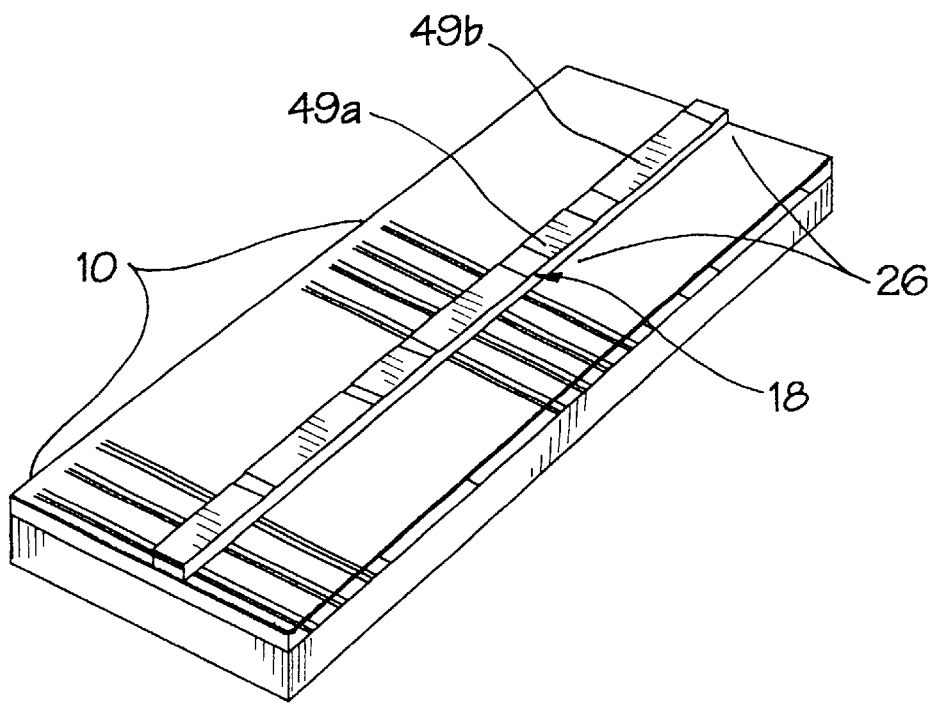
FIG. 7a is a schematic of another embodiment of a tunable laser including series connected detectors.
Figure 7B:
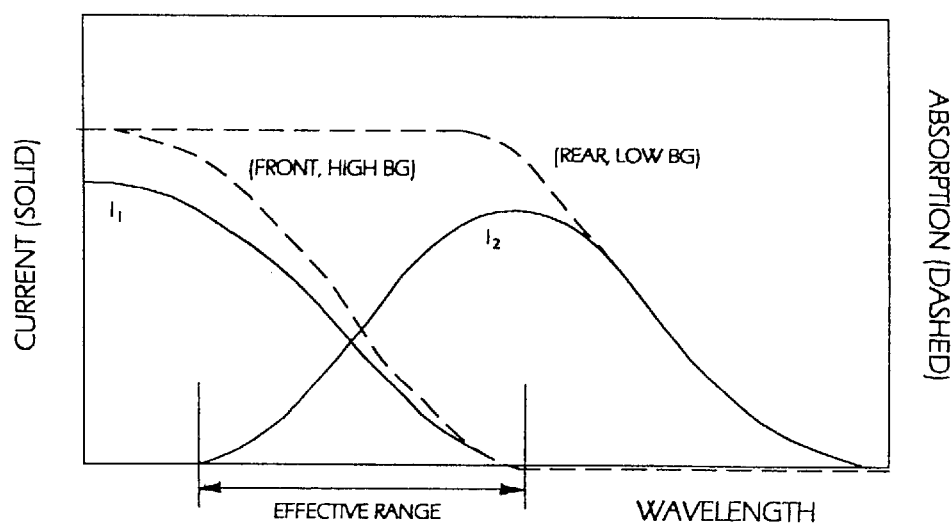
FIG. 7b is a graph of the photocurrents from two detectors shown as a function of wavelength.

Another potential embodiment for the wavelength monitor 26 would employ a pair of detectors 49a and 49b with different bandgaps placed in series along a single passive waveguide continuing from the output 18 of laser 10 as illustrated in FIG. 7a. As can be seen, this embodiment eliminates the need for the Y-branch splitter as well as the dispersive TMI dispersive waveguide section. The back detector 49b is highly absorbing across the entire band while the front detector 49a has an absorption edge beginning near the shorter wavelength side of the tuning range as illustrated in FIG. 7b. This front detector 49a is relatively short, so that it only partially absorbs the incident light, thus transmitting about half of it in the center of the laser's tuning range. Thus, the net photocurrent would appear as in FIG. 7b for the two detectors. Therefore, as in other cases an unambiguous wavelength readout can be obtained by using the ratio of the difference to the sum of the two currents. An advantage of this embodiment is that it is much shorter than ones requiring the TMI and Y-branch sections.

It is also possible to implement the wavelength monitor 26 using an external device as shown in the schematic diagram of FIG. 8. In this embodiment a dielectric filter 50 is used with a wavelength dependent response and a pair of detectors 52a and 52b. A 10/90 fiber optic splitter 54 is used to tap some of the output light from the laser 10 on optic fiber 57 which is split using a 3 dB coupler 56 into two separate optic fibers 58a and 58b. One fiber 58b is coupled directly to a reference detector 52b. Detector 52b monitors the laser power. The other fiber 58a has a collimator 60 with the filter element 50 in front of it. This gives it a wavelength dependent response. The signal from detector 52a is divided in a controller circuit 62 coupled to laser 10 by the signal from the reference detector 52b to provide a power independent signal.

Figure 9:
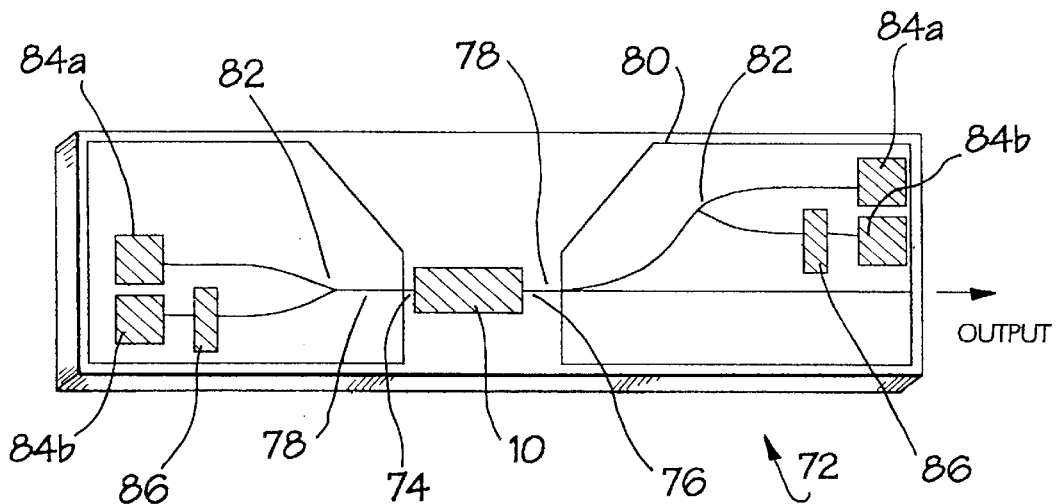
FIG. 9 is a top plan schematic view of still another embodiment of the invention using an external wavelength monitor implementation of a dielectric filter in a planar lightwave circuit platform.

The external device illustrated in FIG. 8 can also be implemented in a very compact manner using a hybrid technology shown in FIG. 9. The laser is mounted accurately onto a planar lightwave circuit (PLC) platform 72 such that the power emitted by either the back 74 or front 76 facet is coupled into the PLC waveguide 78. If the front facet 76 used, the light from the laser 10 is passed first through a wavelength independent 5/95 tap 80 such that the majority of the light can be used as output. Light from back facet 78 is transmitted entirely to monitor 26 without tapping. The monitored or tapped portion of light is then passed though a wavelength independent 3 dB splitter 82 which couples the pair of photodetectors 84a and 84b also bonded to the PLC platform 72. Before detector 84b is a wavelength filtering element 86 is inserted. This can be implemented by a either a waveguide coupler filter or the waveguide can be cut through and the filter described in FIG. 8 is placed in the groove with an index matched epoxy. Again the detection signals are processed by a signal processor or controller (not shown) according to conventional means consistent with the teachings of the invention.

Figure 10:
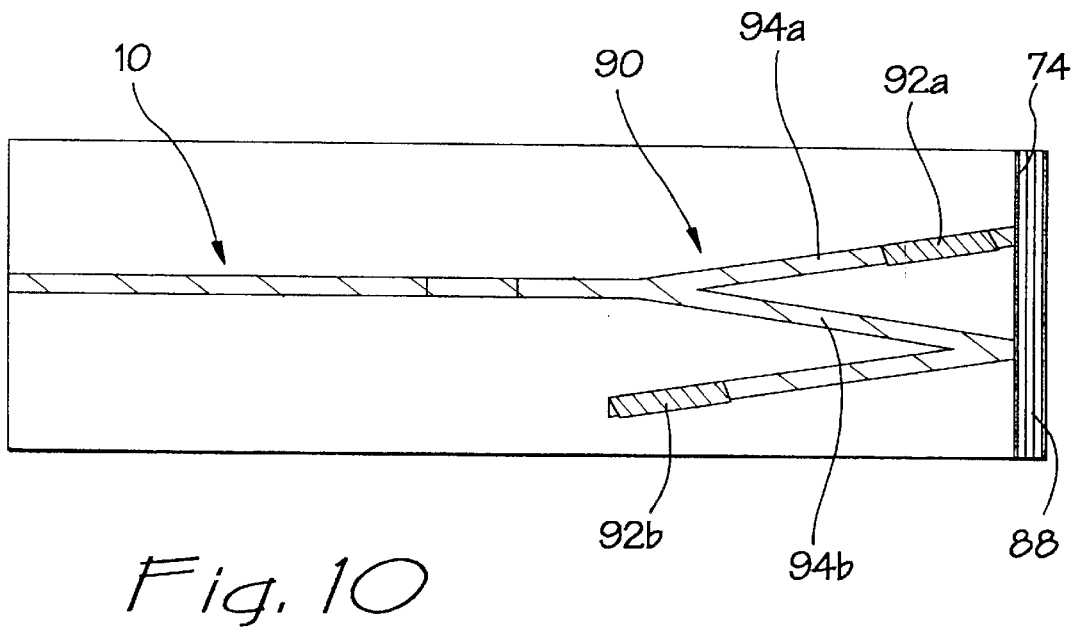
FIG. 10 is a schematic diagram of an embodiment in which reflection from a wavelength dependent dielectric film is used to implement the wavelength monitor.

Another embodiment for the wavelength monitor 26 is diagrammatically shown in FIG. 10. This embodiment employs a filter coating 88 deposited on the back facet 74 of the laser 10. A Y-splitter 90 is used to divide the light into two paths. One path 94a is incident on a reference detector 92a for measuring the light intensity and the other path 94b reflects off of the back facet 74 at an angle of incidence less than the critical angle. Thin film facet coating 88 with a wavelength dependent reflectivity is used. The intensity of the reflected light varies with the wavelength providing a signal which is used for wavelength monitoring in detector 92b. The operation is, thus, similar to the operation of the external circuits of FIGS. 8 and 9. Again the detection signals are processed by a signal processor or controller (not shown) according to conventional means consistent with the teachings of the invention.

Figure 11:
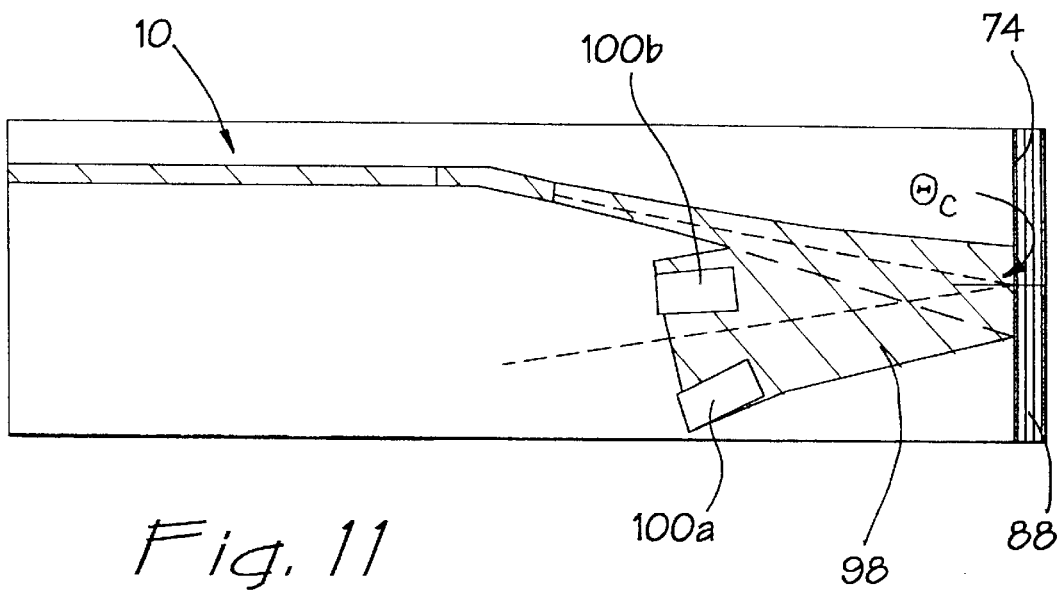
FIG. 11 is a schematic diagram of an embodiment in which reflection from the wavelength dependent dielectric film is used to implement the wavelength monitor as in the case of FIG. 10, but without the use of a beam splitter.

This method is also used in the embodiment schematically shown in FIG. 11 without a Y-splitter 90 by letting the light diffract so that a portion of the light is incident on the facet 74 at an angle greater than the critical angle, $\theta_c$, and a portion is incident at an angle less than the critical angle, $\theta_c$. The laser output may be curved somewhat to facilitate separation of these two portions and to prevent feedback into the laser section. Light from back facet 74 is reflected by wavelength dependent facet coating 88 at an angle to facet 74. The portion of light which was subject to total internal reflection 98 is collected by a reference detector 100a and the portion which is subject to a wavelength dependent reflection is collected by a second detector 100b. The function of facet coating 88 might also be accomplished by an integrated grating similar to those formed in the tunable laser. The operation is again similar to the external circuits of FIGS. 8 and 9.

Figure 12C:
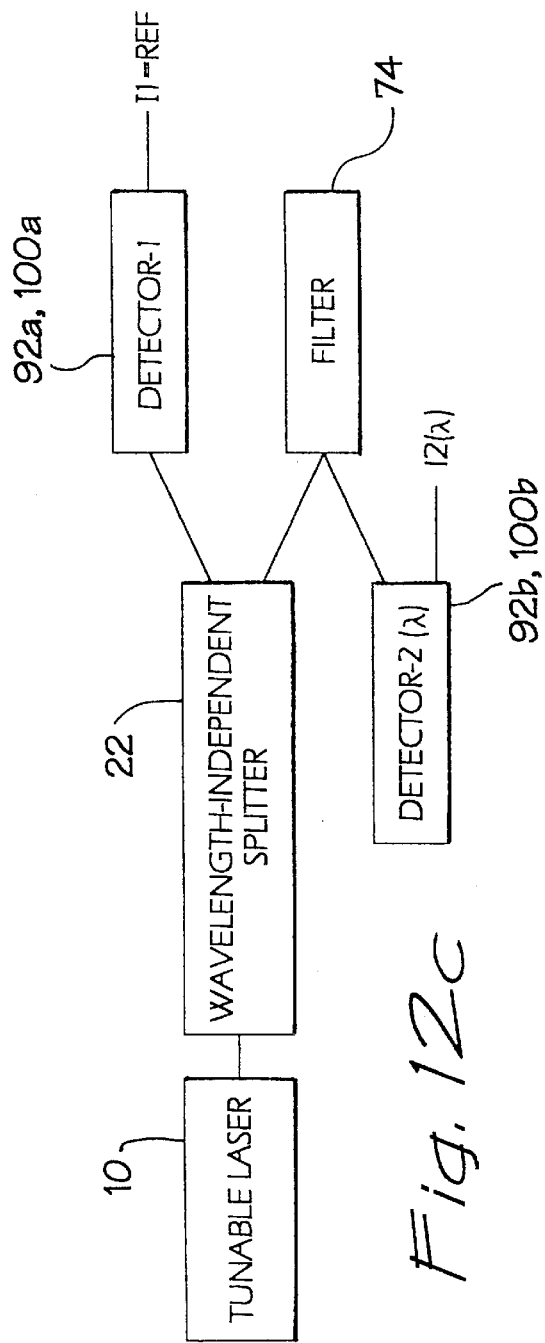

In summary, the primary embodiments of the invention are symbolically depicted in the block diagrams of FIGS. 12a–12f. FIG. 12a symbolizes the embodiments of FIGS. 1 and 4 where tunable laser 10 is coupled through a wavelength dependent splitter 20, 22 to detectors 24a and 24b or 48a and 48b respectively in which the reference signal is the sum of two detector currents.

FIG. 12b symbolizes the embodiment of FIG. 8 which is illustrated there diagrammatically as a discrete implementation, but could be implemented in a monolithic design as well. In FIG. 12a splitter 22 is wavelength independent and wavelength dependent filter 50 is placed between splitter 22 and monitoring detector 49b. The reference signal is the current output from detector 49a.

FIG. 12c symbolizes the embodiments of FIGS. 10 and 11 in which splitter 22 is wavelength independent and a wavelength dependent reflection filter 74 is placed between splitter 22 and monitoring detector 92b and 100b respectively. The reference signal is the current output from detector 92a and 100a respectively.

Figure 4:
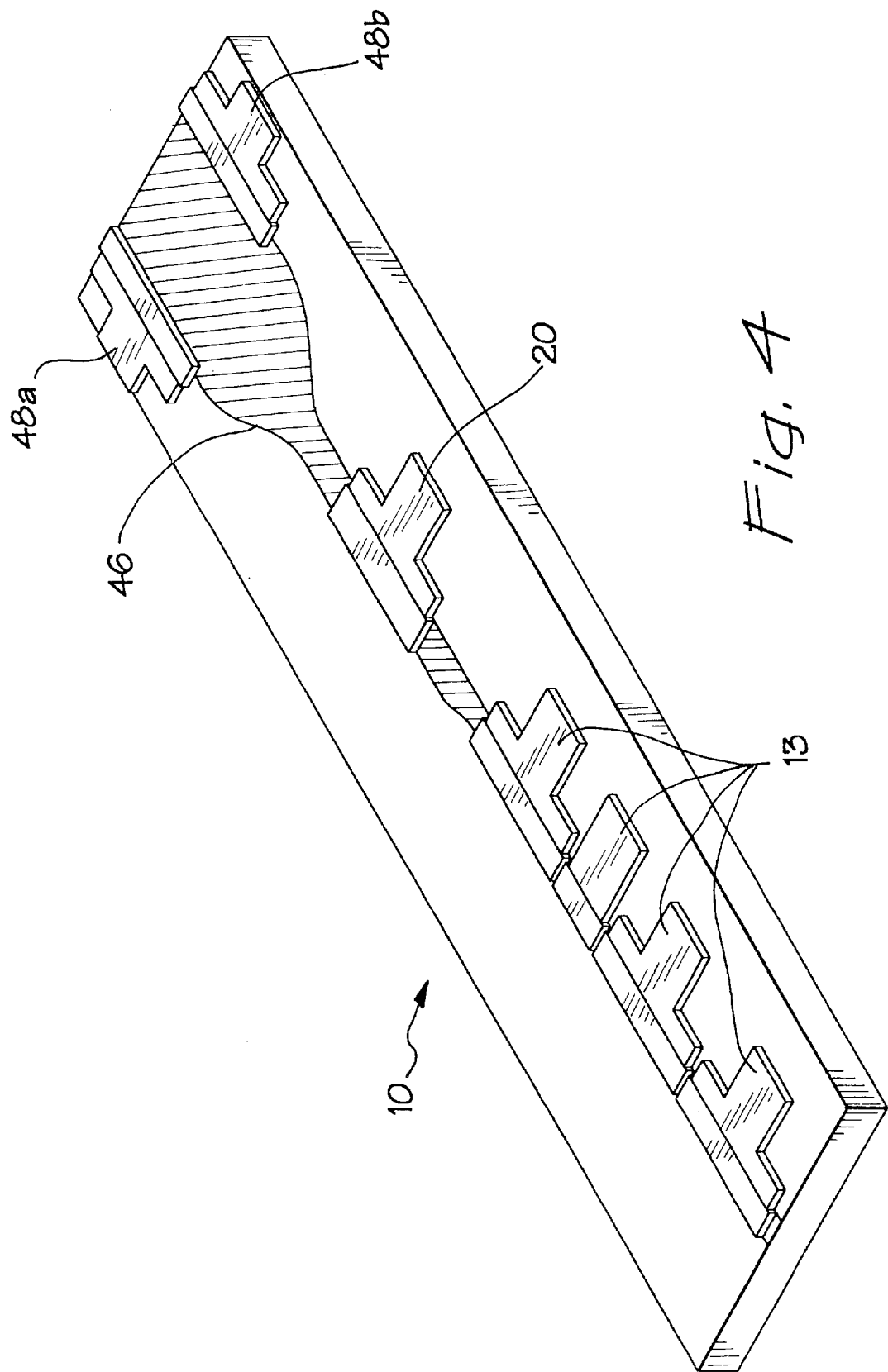
FIG. 4 is a perspective schematic of another embodiment of a tunable laser fabricated according to the invention in which a buried heterostructure is provided.
Figure 12D:
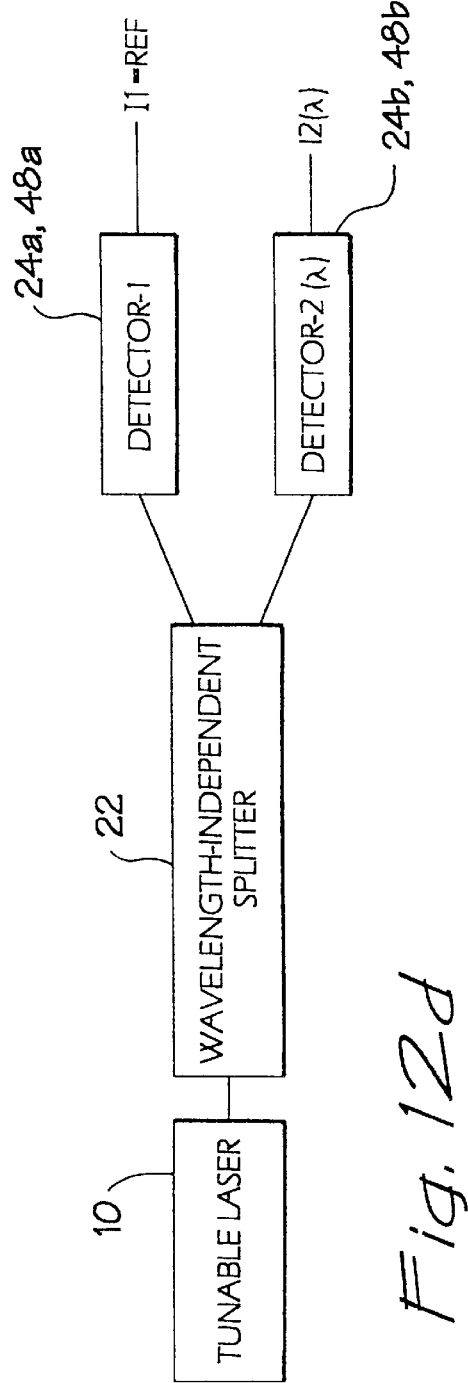

FIG. 12d symbolizes the embodiments of FIGS. 1 and 4 in which detector 24b and 48b respectively is itself wavelength dependent by reason of a higher bandgap absorber in wavelength dependent detector 24b and 48b respectively and in which TMI waveguide 20 is omitted. Splitter 22 is wavelength independent. The reference signal is the current output from detector 24a and 48a respectively.

Figure 12E:
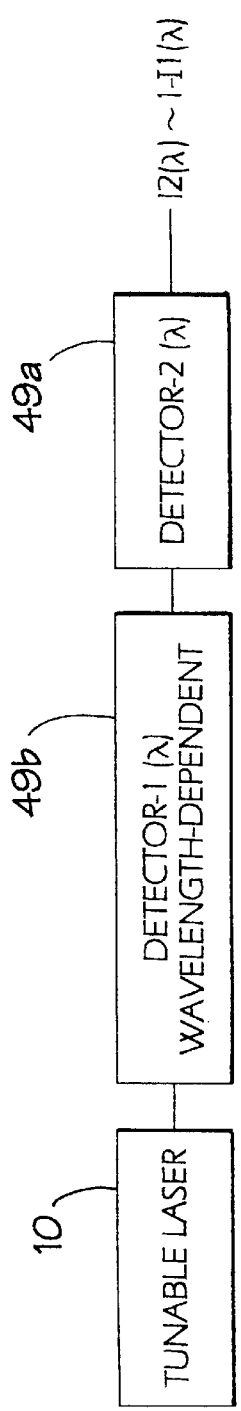

FIG. 12e symbolizes the embodiment of FIG. 7 in which there is no splitter 22, but an inline monitor comprised of wavelength dependent detector 49b, which is itself wavelength dependent by reason of a higher bandgap absorber in detector 49b is placed between tunable laser 10 and detector 49a. The reference signal is the sum of the current output from detectors 49a and 49b.

Figure 12F:
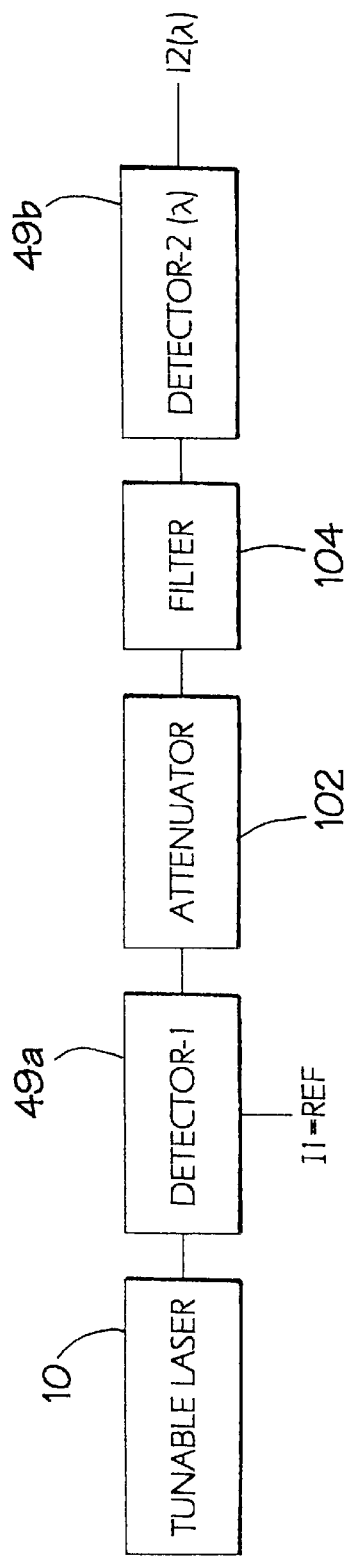

FIG. 12f symbolizes the embodiment of FIG. 7 in which an inline attenuator 102 and filter 104 have been added between detector 49a and wavelength dependent detector 49b. The reference signal is the current output from detector 49a.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more of different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An apparatus comprising:
   an integrated tunable laser fabricated on a single integrated semiconductor chip;
   a wavelength-dependent optical means fabricated on the integrated semiconductor chip for producing two optical signals from light sampled from said laser, which two optical signals are wavelength dependent and distinguished from each other by a different dependence on wavelength;
   a first and second detector fabricated on the integrated semiconductor chip to detect said two optical signals to generate two corresponding electrical detection signals; and
   a processor coupled to said first and second detector to generate a control signal from said two corresponding electrical detection signals by which said tunable laser is tuned.

2. The apparatus of claim 1 wherein said wavelength-dependent optical means comprises a two mode interference waveguide fabricated on the integrated semiconductor chip in which the propagated signal is the interference signal between two different modes of light.

3. The apparatus of claim 2 further comprising a wavelength-dependent Y-branch splitter fabricated on the integrated semiconductor chip coupled between said two mode interference waveguide and said first and second detector.

4. The apparatus of claim 1 where said first and second detector comprises a segmented detector and further comprising a flared waveguide coupling said two mode interference waveguide and said segmented detector.

5. The apparatus of claim 1 where said a wavelength-dependent optical means comprises a wavelength-dependent optical filter.

6. The apparatus of claim 1 where said wavelength-dependent optical means comprises a wavelength-dependent optical coating.

7. The apparatus of claim 6 further comprising a splitter fabricated on the integrated semiconductor chip, said splitter directing a first portion of light from said laser to said first detector and directing a second portion of light from said laser to said coating, said second detector detecting light reflected from said coating.

8. The apparatus of claim 6 further comprising a diffractor fabricated on the integrated semiconductor chip, said diffractor directing a first portion of light from said laser into said coating such that said first portion is totally internally reflected and directing a second portion of light from said laser into said coating such that said second portion of light from said laser is reflected through said coating to said second detector.

9. The apparatus of claim 1 where said a wavelength-dependent optical means comprises a wavelength-dependent optical grating.

10. The apparatus of claim 1 where said wavelength-dependent optical means comprises one of said first and second detectors, said one detector defined as a monitoring detector.

11. The apparatus of claim 10 where said monitoring detector has a higher bandgap absorber therein than said other one of said first and second detectors.

12. The apparatus of claim 11 where said monitoring detector is coupled inline between said tunable laser and said other one of said first and second detectors.

13. The apparatus of claim 11 further comprising an attenuator and a filter fabricated on the integrated semiconductor chip and where said monitoring detector is coupled inline with said other one of said first and second detectors which is coupled to said tunable laser, and between which monitoring detector and said other one of said first and second detectors said attenuator and said filter are coupled in line.

14. A method of operating an integrated tunable laser comprising:
   sampling light from said laser fabricated on a single integrated semiconductor chip;
   producing two optical signals within the integrated semiconductor chip from light sampled from said laser, which two optical signals are wavelength dependent and distinguished from each other by a different dependence on wavelength;
   detecting said two optical signals within the integrated semiconductor chip to generate two corresponding electrical detection signals;
   generating a wavelength dependent control signal from said two corresponding electrical detection signals; and
   feeding back said control signal to said tunable laser to control wavelength of light generated by said laser.

15. The method of claim 14 wherein producing two optical signals is performed by creating within the integrated semiconductor chip a wavelength dependent, beat pattern between two modes of light.

16. The method of claim 15 where creating a wavelength dependent, beat pattern between two modes of light is performed for several beat lengths of said two modes of light and then comprises splitting said two modes light into first and second paths in the integrated semiconductor chip and thereafter detecting said two modes of light in said first and second paths in the integrated semiconductor chip.

17. The method of claim 16 where splitting said sampled light into a first and second path comprises splitting said two modes of light into said first and second path with a wavelength dependent splitting ratio in the integrated semiconductor chip.

18. The method of claim 16 wherein splitting said sampled light comprises transmitting said two modes of light to two segmented detectors in the integrated semiconductor chip, wherein detecting said two optical signals comprises detecting said light in said two segmented detectors to provide two complementary sinusoidal detection signals in the integrated semiconductor chip, and wherein generating a wavelength dependent control signal comprises generating said control signal as a ratio between the difference of said two complementary sinusoidal detection signals and the sum of said two complementary sinusoidal detection signals in the integrated semiconductor chip.

19. The method of claim 15 where producing two optical signals comprises diffracting said light back onto a back facet in the integrated semiconductor chip of said laser so that a portion is totally internally reflected and a portion reflected back from a wavelength dependent coating disposed on said back facet.

20. The method of claim 14 wherein producing two optical signals is performed by monotonically filtering within the integrated semiconductor chip said light as a function of wavelength.

21. The method of claim 20 wherein producing two optical signals is performed by monotonically filtering said light as a function of wavelength by transmission through a grating in the integrated semiconductor chip.

22. The method of claim 20 wherein producing two optical signals is performed by monotonically filtering said light as a function of wavelength by reflection from a grating in the integrated semiconductor chip.

23. The method of claim 22 wherein producing two optical signals is performed by monotonically filtering said light in the integrated semiconductor chip as a function of wavelength by reflecting said light off a back facet of said tunable laser through a wavelength dependent coating disposed on said back facet.

24. The method of claim 20 wherein said tunable laser has a tuning range, and wherein the degree of filtering the intensity of said light is varied in the integrated semiconductor chip between extremums corresponding to said tuning range of said laser.

25. The method of claim 14 further comprising determining total power output from said laser by summing said two corresponding electrical detection signals in the integrated semiconductor chip.

26. The method of claim 25 where generating a wavelength dependent control signal comprises generating a control signal in the integrated semiconductor chip from a ratio of intensity of said light detected corresponding to said two optical signals by normalizing said control signal with said total power output.

27. The method of claim 14 where producing and detecting said two optical signals comprises detecting said light with a first detector in the integrated semiconductor chip with an absorber in the integrated semiconductor chip having a bandgap energy low enough to provide substantially full absorption of said light, and detecting said light with a second detector in the integrated semiconductor chip with an absorber in the integrated semiconductor chip having a bandgap energy slightly greater than the shortest wavelength of said light so that absorption in said second detector varies with wavelength of said light.

28. The method of claim 14 where producing two optical signals comprises splitting said light into two detectors in the integrated semiconductor chip in which at least one of said detectors detects said light in a wavelength dependent manner.

29. The method of claim 14 where producing two optical dependents comprises transmitting said light through a first detector in the integrated semiconductor chip into a second detector in the integrated semiconductor chip in which at least one of said detectors detects said light in a wavelength dependent manner.

30. The method of claim 29 where producing two optical signals comprises transmitting said light first through said first detector and then into said second detector in which at least said first detector detects said light in a wavelength dependent manner.

31. The method of claim 29 where producing two optical signals comprises transmitting said light first through said first detector, then through an attenuator and filter in optical series, and then into said second detector in which at least said second detector detects said light in a wavelength dependent manner.

32. A method of operating an integrated tunable laser comprising:

sampling light from said laser fabricated on a single integrated semiconductor chip;

generating two signals within the integrated semiconductor chip from said light sampled from said laser, which two signals are wavelength dependent and distinguished from each other by a different dependence on wavelength;

generating within the integrated semiconductor chip two detected signals corresponding to said two signals;

combining said two detected signals within the integrated semiconductor chip to produce a wavelength dependent control signal; and tuning said laser by feeding back within the integrated semiconductor chip said wavelength dependent control signal to said tunable laser.

* * * * *